(12) United States Patent
Peng et al.

(10) Patent No.: US 12,245,451 B2
(45) Date of Patent: Mar. 4, 2025

(54) LIGHT-TRANSMITTING DISPLAY PANEL AND METHOD FOR MANUFACTURING THE SAME, AND DISPLAY PANEL

(71) Applicant: KunShan Go-Visionox Opto-Electronics Co., Ltd, Jiangsu (CN)

(72) Inventors: Chao Chi Peng, Kunshan (CN); Mingxing Liu, Kunshan (CN); Panpan Wang, Kunshan (CN); Weili Li, Kunshan (CN); Shuaiyan Gan, Kunshan (CN)

(73) Assignee: KUNSHAN GO-VISIONOX OPTO-ELECTRONICS CO., LTD, Kunshan (CN)

( * ) Notice: Subject to any disclaimer, the term of this patent is extended or adjusted under 35 U.S.C. 154(b) by 466 days.

(21) Appl. No.: 17/545,200

(22) Filed: Dec. 8, 2021

(65) Prior Publication Data

US 2022/0102670 A1 Mar. 31, 2022

Related U.S. Application Data

(63) Continuation of application No. PCT/CN2020/109864, filed on Aug. 18, 2020.

(30) Foreign Application Priority Data

Nov. 29, 2019 (CN) .......................... 201911205394.3

(51) Int. Cl.
*H10K 50/822* (2023.01)
*H10K 50/813* (2023.01)
(Continued)

(52) U.S. Cl.
CPC ......... *H10K 50/828* (2023.02); *H10K 50/813* (2023.02); *H10K 50/822* (2023.02); *H10K 59/12* (2023.02); *H10K 2102/103* (2023.02)

(58) Field of Classification Search
CPC ........... H10K 50/822; H10K 59/80521; H10K 59/12; H10K 59/131; H10K 59/1315;
(Continued)

(56) References Cited

U.S. PATENT DOCUMENTS

2003/0006699 A1* 1/2003 Ogino .................... H10K 59/35
313/506
2014/0353693 A1* 12/2014 Yeh ........................ H01L 27/124
257/89
(Continued)

FOREIGN PATENT DOCUMENTS

CN 104037359 A 9/2014
CN 107256882 A 10/2017
(Continued)

OTHER PUBLICATIONS

Notification to Grant issued on Mar. 25, 2022, in connection with corresponding Chinese Application No. 201911205394.3 (6 pp., including machine-generated English translation).
(Continued)

*Primary Examiner* — Tucker J Wright
*Assistant Examiner* — David W Ward
(74) *Attorney, Agent, or Firm* — Maier & Maier, PLLC (57) ABSTRACT

A light-transmitting display panel and a display panel. The light-transmitting display panel includes an array substrate; first electrodes located on the array substrate; first light-emitting structures, each of the first light-emitting structures being located on one of the first electrodes; and a second electrode layer group located on the first light-emitting structures and including a first sub-electrode layer and a second sub-electrode layer that are stacked, where the first sub-electrode layer includes electrode blocks spaced from each other, an orthographic projection of each of the electrode blocks on the array substrate covers an orthographic
(Continued)

projection of at least one first electrode on the array substrate, the second sub-electrode layer connects at least a part of adjacent electrode blocks of the electrode blocks, and transmittance of the second sub-electrode layer is greater than transmittance of the electrode blocks.

14 Claims, 9 Drawing Sheets

(51) Int. Cl.
*H10K 50/828* (2023.01)
*H10K 59/12* (2023.01)
*H10K 102/10* (2023.01)

(58) Field of Classification Search
CPC ........... H10K 50/813; H10K 59/80515; H10K 59/351–353
See application file for complete search history.

(56) References Cited

U.S. PATENT DOCUMENTS

| | | | |
|---|---|---|---|
| 2018/0301521 A1* | 10/2018 | Yang | H10K 59/35 |
| 2019/0081264 A1* | 3/2019 | Yun | H10K 50/822 |
| 2019/0237527 A1* | 8/2019 | Lee | H10K 59/80522 |
| 2021/0111231 A1* | 4/2021 | Choi | H10K 50/844 |
| 2021/0233981 A1* | 7/2021 | Chen | H10K 59/80523 |
| 2021/0408152 A1* | 12/2021 | Lou | H10K 59/80515 |

FOREIGN PATENT DOCUMENTS

| | | |
|---|---|---|
| CN | 107359274 A | 11/2017 |
| CN | 108574053 A | 9/2018 |
| CN | 108807497 A | 11/2018 |
| CN | 109801950 A | 5/2019 |
| CN | 109962177 A | 7/2019 |
| CN | 110061014 A | 7/2019 |
| CN | 110070801 A | 7/2019 |
| CN | 209487510 U | 10/2019 |
| CN | 110890477 A | 3/2020 |
| KR | 20160087990 A | 7/2016 |

OTHER PUBLICATIONS

International Search Report (with English Translation) and Written Opinion (with Machine Translation) issued on Nov. 6, 2020 in corresponding International Application No. PCT/CN2020/109864; 14 pages.

Office Action issued on Feb. 1, 2021, in connection with corresponding Chinese Application No. 201911205394.3 (20 pp., including machine-generated English translation).

Office Action issued on Jun. 21, 2021, in connection with corresponding Chinese Application No. 201911205394.3 (7 pp., including partial machine-generated English translation).

* cited by examiner

LIGHT-TRANSMITTING DISPLAY PANEL AND METHOD FOR MANUFACTURING THE SAME, AND DISPLAY PANEL

CROSS-REFERENCE TO RELATED APPLICATIONS

This application is a continuation of International Application No. PCT/CN2020/109864, filed on Aug. 18, 2020, which claims priority to Chinese Patent Application No. 201911205394.3, filed on Nov. 29, 2019, both of which are hereby incorporated by reference in their entireties.

TECHNICAL FIELD

The present application relates to the field of display, and in particular to a light-transmitting display panel and a method for manufacturing the same, and a display panel.

BACKGROUND

With the rapid development of electronic devices, the requirements of users on screen-to-body ratios become higher and higher. Thus, full-screen displays for electronic devices are interested more and more by the industry.

Traditional electronic devices such as mobile phones and tablets need integrated front-facing cameras, earpieces, and infrared sensing components. In the prior art, notches or holes are provided on the display screens, so that external light can enter photosensitive elements under the screens through the notches or holes on the screens. However, these electronic devices do not have literally full-screen displays, and not all regions across their screens can be used for displaying. For example, regions corresponding to the front cameras cannot be used for displaying.

SUMMARY

The present application provides a light-transmitting display panel and a method for manufacturing the same, and a display panel, so as to realize that at least some of the regions of the display panel are able to transmit light and can be used for displaying, which facilitates the under-screen integration of photosensitive components.

In a first aspect, the embodiments of the present application provide a light-transmitting display panel. The light-transmitting display panel includes: an array substrate; one or more first electrodes located on the array substrate; at least one first light-emitting structure, each of the at least one first light-emitting structure being located on one of the first electrodes; and a second electrode layer group located on the first light-emitting structure and including a first sub-electrode layer and a second sub-electrode layer that are stacked, where the first sub-electrode layer includes a plurality of electrode blocks spaced from each other, an orthographic projection of each of the plurality of electrode blocks on the array substrate covers an orthographic projection of at least one of the first electrodes on the array substrate, the second sub-electrode layer connects at least a part of adjacent electrode blocks of the plurality of electrode blocks, and light-transmitting performance of the second sub-electrode layer is greater than light-transmitting performance of the plurality of electrode blocks.

In a second aspect, the embodiments of the present application provide a display panel having a first display region and a second display region adjoining each other, transmittance of the first display region being greater than transmittance of the second display region, where the first display region of the display panel is configured as the light-transmitting display panel according to any one of the above implementations.

In a third aspect, the embodiments of the present application provide a method for manufacturing a light-transmitting display panel, which includes: provide an array substrate; forming a first electrode on the array substrate; forming a first light-emitting structure on the first electrode; and forming a first sub-electrode layer and a second sub-electrode layer on the first light-emitting structure to form a second electrode layer group, the first sub-electrode layer and the second sub-electrode layer being stacked, where the forming a first sub-electrode layer includes forming electrode blocks spaced from each other, an orthographic projection of each of the electrode blocks on the array substrate covers an orthographic projection of at least one first electrode on the array substrate, the forming a second sub-electrode layer includes forming the second sub-electrode layer capable of connecting at least a part of adjacent electrode blocks of the plurality of electrode blocks, and light-transmitting performance of the second sub-electrode layer is greater than light-transmitting performance of the electrode blocks.

In the light-transmitting display panel according to the embodiments of the present application, the second electrode layer group includes the first sub-electrode layer and the second sub-electrode layer that are stacked. The orthographic projections of the electrode blocks included in the first sub-electrode layer on the array substrate cover the orthographic projection of the at least one of the first electrodes on the array substrate, which ensures that the formed sub-pixels have high color accuracy. The second sub-electrode layer connects at least a part of the adjacent electrode blocks, and the light-transmitting performance of the second sub-electrode layer is greater than the light-transmitting performance of the electrode blocks, thereby improving light-transmitting performance of the non-luminous region around the sub-pixels while ensuring the normal displaying by the sub-pixels. Photosensitive components can be integrated on the back of the light-transmitting display panel to realize that the photosensitive components such as a camera are integrated under the screen and the light-transmitting display panel can display images at the same time, thereby realizing a full-screen design where the light-transmitting display panel is used in a display apparatus.

BRIEF DESCRIPTION OF THE DRAWINGS

Features, objects and advantages of the present application will be apparent from the detailed description of non-limiting embodiments which follows, taken in conjunction with the accompanying drawings, in which like references indicate same or similar features and the figures have not necessarily been drawn to scale.

DETAILED DESCRIPTION

In order to make the objects, technical solutions and advantages of the present application clearer, the present application is further described in detail below with reference to the drawings and specific embodiments. It should be understood that, the specific embodiments described herein are only for illustration of the present application, instead of limiting the present application. For those skilled in the art, the present application can be implemented without some of these specific details.

In electronic devices such as mobile phones and tablets, photosensitive components (e.g., front cameras, infrared light sensors, and proximity light sensors) are required to be integrated on the side where display panels are provided. In some embodiments, light-transmitting display regions may be provided on the above-described electronic devices, and the photosensitive components may be arranged on the back of the light-transmitting display regions, so that full-screen displaying by the electronic devices can be realized with the operation of the photosensitive components being ensured.

In order to ensure good displaying effect by the light-transmitting display regions, cathodes of sub-pixels in the light-transmitting display regions are required to meet predetermined light-transmitting performance. However, the light-transmitting performance of the cathodes of the sub-pixels in the light-transmitting display regions cannot be unlimitedly improved. Therefore, the light-transmitting performance of the light-transmitting display regions cannot meet the requirements of the integrated photosensitive components.

In order to solve the above problems, the embodiments of the present application provide a light-transmitting display panel and a method for manufacturing the same, and a display panel. Various embodiments of the light-transmitting display panel and the method for manufacturing the same, and the display panel will be described below with reference to the accompanying drawings.

The embodiments of the present application provide a light-transmitting display panel, which may be an organic light emitting diode (OLED) display panel.

The "light-transmitting display panel" used herein refers to a display panel with transmittance being greater than or equal to 15%. In order to ensure that transmittance of the light-transmitting display panel is greater than or equal to 15%, greater than 40%, or even more, transmittance of at least some of functional film layers of the light-transmitting display panel according to the embodiments of the present application is greater than 80% or even greater than 90%.

Figure 1:
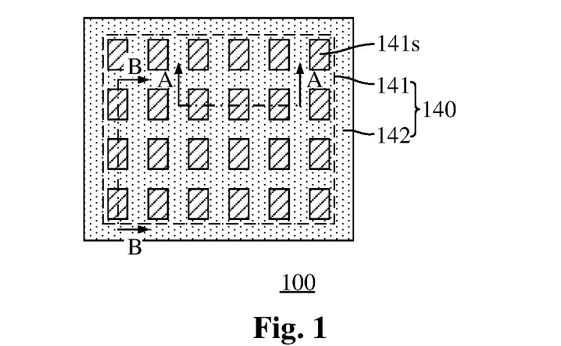
FIG. 1 is a schematic top view of a light-transmitting display panel according to a first embodiment of the present application.
Figure 2:
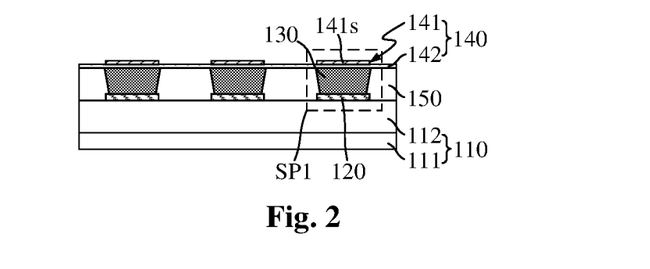
FIG. 2 is a schematic cross-sectional view along the A-A direction shown in FIG. 1.
Figure 3:
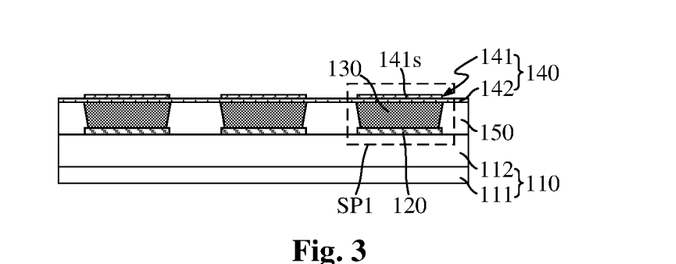
FIG. 3 is a schematic cross-sectional view along the B-B direction shown in FIG. 1.

FIG. 1 is a schematic top view of a light-transmitting display panel according to a first embodiment of the present application. FIG. 2 is a schematic cross-sectional view along the A-A direction shown in FIG. 1. FIG. 3 is a schematic cross-sectional view according to the B-B direction shown in FIG. 1. The light-transmitting display panel 100 includes an array substrate 110, first electrodes 120, one or more first light-emitting structure 130, and a second electrode layer group 140.

The array substrate 110 includes a substrate 111 and a device layer 112 on the substrate 111. The substrate 111 may be made of light-transmitting materials such as glass or polyimide (PI). The device layer 112 may include pixel circuits for driving displaying by respective sub-pixels.

The light-transmitting display panel 100 may further include a pixel defining layer 150 located on the device layer 112. The pixel defining layer 150 may include pixel openings.

The first electrodes 120 are located on the array substrate 110. Optionally, the first electrodes 120 may be arranged in an array. Each of the first light-emitting structures 130 is located on one of the first electrodes 120. At least some of the pixel openings of the pixel defining layer 150 are configured to receive the first light-emitting structures 130. The second electrode layer group 140 is located on the first light-emitting structures 130. Each of the first electrodes 120, its corresponding first light-emitting structure 130, and its corresponding second electrode layer group 140 form a first sub-pixel SP1. The first electrode 120 may be connected to its corresponding pixel circuit in the device layer, so that the pixel circuit drives displaying by the first sub-pixel Sp1.

One of the first electrode 120 and the second electrode layer group 140 is an anode, and the other is a cathode. Here, for illustration, the first electrode 120 is taken as an anode and the second electrode layer group 140 is taken as a cathode.

Optionally, the first electrode 120 may be a light-transmitting electrode. The first electrode 120 may include an indium tin oxide (ITO) layer or an indium zinc oxide (IZO) layer. Optionally, the first electrode 120 may be a light-proof electrode, that is, the first electrode 120 may be a reflective electrode, so that the displaying effect by the formed first sub-pixel SP1 can be improved. The reflective electrode may include a first light-transmitting conductive layer, a reflective layer on the first light-transmitting conductive layer, and a second light-transmitting conductive layer on the reflective layer. The first light-transmitting conductive layer and the second light-transmitting conductive layer may be made of ITO, IZO, etc., and the reflective layer may be a metal layer which for example is made of silver.

The first light-emitting structure 130 may include an emitting layer (EML). Depending on different colors of light emitted by the EMLs, the formed first sub-pixels SP1 may be categorized into multiple types. The first sub-pixels SP1 may include first sub-pixels emitting red light, first sub-pixels emitting green light, and first sub-pixels emitting blue light, but of course, other examples are not limited thereto. Depending on the design requirements of the first light-emitting structure 130, the first light-emitting structure 130 may further include at least one of a hole inject layer (HIL), a hole transport layer (HTL), and an electron inject layer (EIL), or an electron transport layer (ETL).

In this embodiment, the second electrode layer group 140 includes a first sub-electrode layer 141 and a second sub-electrode layer 142 that are stacked. The first sub-electrode layer 141 includes electrode blocks 141s spaced from each other. An orthographic projection of each of the electrode blocks 141s on the array substrate 110 overlaps an orthographic projection of at least one first electrode 120 on the array substrate 110. The second sub-electrode layer 142 connects at least a part of adjacent electrode blocks 141s. Light-transmitting performance of the second sub-electrode layer 142 is greater than light-transmitting performance of the electrode blocks 141s. The second sub-electrode layer 142 can directly or indirectly electrically interconnect the electrode blocks 141s, so that the second electrode layer group 140 is a common electrode of the light-transmitting display panel 100.

In this embodiment, for illustration, the orthographic projection of each electrode block 141s on the array substrate 110 is exemplified as covering an orthographic projection of one first electrode 120 on the array substrate 110, that is, a position of each electrode block 141s is corresponding to a position of one first electrode 120. In some other embodiments, the orthographic projection of each electrode block 141s on the array substrate 110 may cover orthographic projections of 2, 4, or other numbers of first electrodes 120 on the array substrate 110.

In the light-transmitting display panel 100 according to this embodiment of the present application, the orthographic projection of the electrode block 141s on the array substrate 110 covers the orthographic projection of at least one first electrode 120 on the array substrate 110, which ensures that the formed first sub-pixel SP1 has high color accuracy. The second sub-electrode layer 142 connects at least a part of the adjacent electrode blocks 141s, and the light-transmitting performance of the second sub-electrode layer 142 is greater than that of the electrode blocks 141s, thereby improving the light-transmitting performance of the non-luminous regions around the first sub-pixels SP1 while ensuring the normal displaying by the first sub-pixels SP1, which further improves average light-transmitting performance of the light-transmitting display panel 100. Photosensitive components can be integrated on the back of the light-transmitting display panel 100 to realize that the photosensitive components such as a camera are integrated under the screen and the light-transmitting display panel 100 can display images at the same time, thereby realizing a full-screen design where the light-transmitting display panel 100 is in a display device.

Optionally, the first sub-electrode layer 141 may include a ytterbium layer or a magnesium-silver alloy layer, so that the first sub-electrode layer 141, the first electrode 120 and the layer structure therebetween can create a suitable microcavity effect. The displaying effect by the formed first sub-pixel SP1 can be improved, and the likelihood of occurrence of color shift can be reduced.

Optionally, the second sub-electrode layer 142 may include an indium tin oxide layer or an indium zinc oxide layer. In some other embodiments, the second sub-electrode layer 142 may have other transparent conductive layer structures, thereby improving light-transmitting performance of regions between the adjacent electrode blocks 141s of the first sub-electrode layer 141.

Optionally, an orthographic projection of each first light-emitting structure 130 on the array substrate 110 may be composed of one first shape unit or composed of two or more first shape units joined together. The first shape unit may include at least one shape selected from a group consisting of a circle, an oval, a dumbbell, a gourd, and a rectangle, which can reduce diffraction in the light-transmitting display panel.

Optionally, the orthographic projection of each first electrode 120 on the array substrate 110 may be composed of one second shape unit or composed of two or more second shape units joined together. The second shape unit may include at least one shape selected from a group consisting of a circle, an oval, a dumbbell, a gourd, and a rectangle, which can reduce diffraction in the light-transmitting display panel.

In this embodiment, the second sub-electrode layer 142 is a continuous and complete plane structure, and an orthographic projection of the second sub-electrode layer 142 on the array substrate 110 covers orthographic projections of all electrode blocks 141s on the array substrate 110. The second sub-electrode layer 142 may cover the entire display region of the light-transmitting display panel 100, thereby interconnecting all the electrode blocks 141s.

In the above-mentioned first embodiment, the second sub-electrode layer 142 is located on the first light-emitting structure 130, and the first sub-electrode layer 141 is located on the second sub-electrode layer 142. In some other embodiments, the first sub-electrode layer 141 and the second sub-electrode layer 142 may be stacked in other manners.

Figure 4:
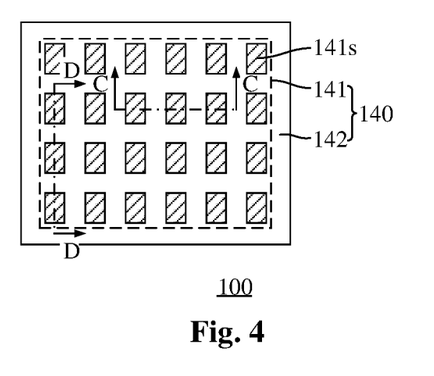
FIG. 4 is a schematic top view of a light-transmitting display panel according to a second embodiment of the present application, where a first sub-electrode layer is located on a first light-emitting structure, a second sub-electrode layer is located on the first sub-electrode layer, the second sub-electrode layer may be a continuous and complete plane structure, and the second sub-electrode layer may be arranged to cover all electrode blocks of the first sub-electrode layer.
Figure 5:
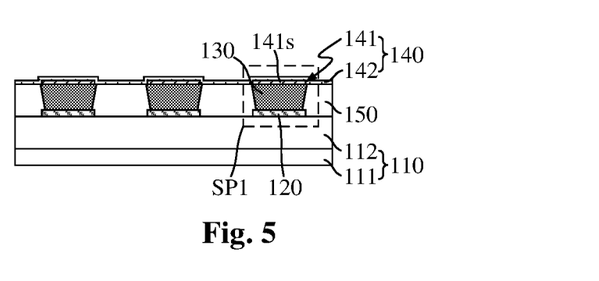
FIG. 5 is a schematic cross-sectional view along the C-C direction shown in FIG. 4.
Figure 6:
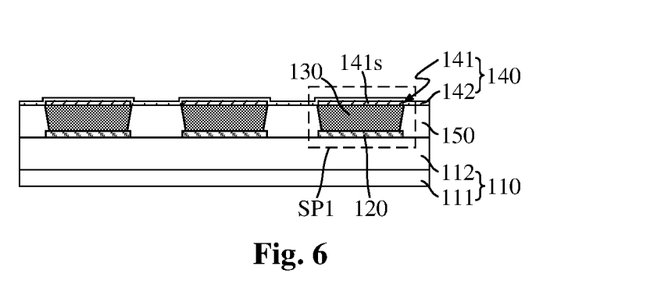
FIG. 6 is a schematic cross-sectional view along the D-D direction shown in FIG. 4.

FIG. 4 is a schematic top view of a light-transmitting display panel according to a second embodiment of the present application. FIG. 5 is a schematic cross-sectional view along the C-C direction shown in FIG. 4. FIG. 6 is a schematic cross-sectional view along the D-D direction shown in FIG. 4. A part of the structure of the light-transmitting display panel 100 according to the second embodiment is the same as that of the light-transmitting display panel 100 according to the first embodiment. Differences between the structure of the light-transmitting display panel 100 according to the second embodiment and the light-transmitting display panel 100 according to the first embodiment will be described below, and the similarities will not be described in detail.

In contrast to the first embodiment, in the second embodiment, the first sub-electrode layer 141 is located on the first light-emitting structure 130, and the second sub-electrode layer 142 is located on the first sub-electrode layer 141. The second sub-electrode layer 142 may be a continuous and complete plane structure, and the second sub-electrode layer 142 may be arranged to cover all electrode blocks 141s of the first sub-electrode layer 141.

In the above embodiments, the second sub-electrode layer 142 has a continuous and complete surface structure, and the orthographic projection of the second sub-electrode layer 142 on the array substrate 110 covers the orthographic projections of all electrode blocks 141s on the array substrate 110. In some other embodiments, the second sub-electrode layer 142 may not be limited to the above arrangement.

Figure 7:
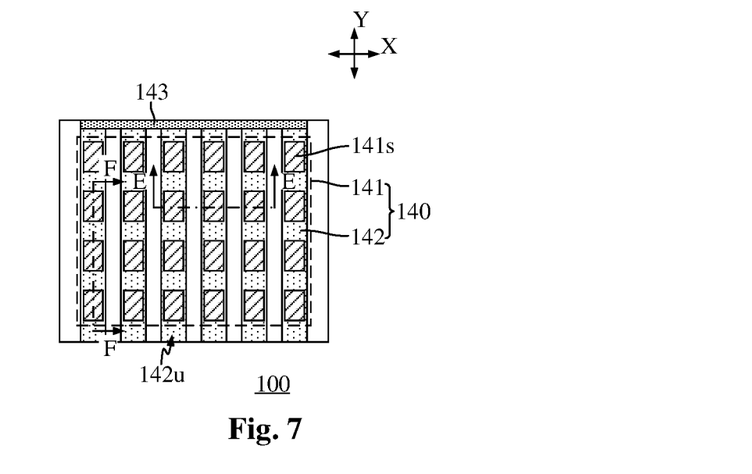
FIG. 7 is a schematic top view of a light-transmitting display panel according to a third embodiment of the present application, where the electrode blocks are arranged in multiple columns, the multiple columns of electrode blocks are arranged in a first direction, and each column of the multiple columns of electrode blocks includes multiple electrode blocks arranged at intervals along a second direction, and the second direction is perpendicular to the first direction.
Figure 8:
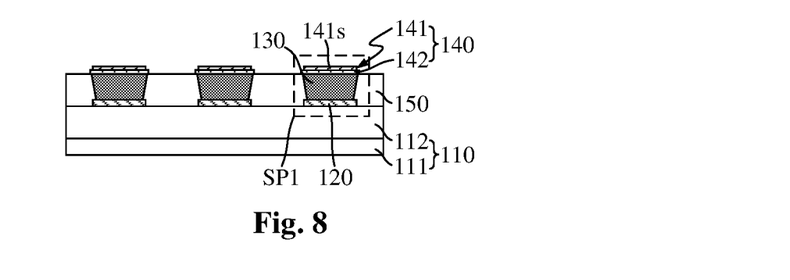
FIG. 8 is a schematic cross-sectional view along the E-E direction shown in FIG. 7.
Figure 9:
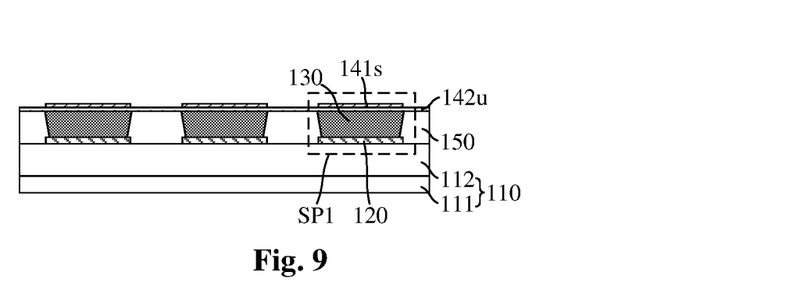
FIG. 9 is a schematic cross-sectional view along the F-F direction shown in FIG. 7.

FIG. 7 is a schematic top view of a light-transmitting display panel according to a third embodiment of the present application. FIG. 8 is a schematic cross-sectional view along the E-E direction shown in FIG. 7. FIG. 9 is a schematic cross-sectional view along the F-F direction shown in FIG. 7. A part of the structure of the light-transmitting display panel 100 according to the third embodiment is the same as that of the light-transmitting display panel 100 according to the first embodiment. Differences between the structure of the light-transmitting display panel 100 according to the third embodiment and the light-transmitting display panel 100 according to the first embodiment will be described below, and the similarities will not be described in detail.

In this embodiment, the electrode blocks 141s are arranged in multiple columns. The multiple columns of electrode blocks 141s are arranged along a first direction X. Each column of the multiple columns of electrode blocks 141s includes multiple electrode blocks 141s arranged at intervals along a second direction Y. The second direction Y is perpendicular to the first direction X.

The second sub-electrode layer 142 includes multiple connecting units 142u arranged along the first direction X, and each connecting unit 142u interconnects electrode blocks 141s in a corresponding columns of the multiple columns of electrode blocks 141s. In this embodiment, each connecting unit 142u is in a shape of a strip extending along the second direction Y. Adjacent connecting units 142u are spaced from each other along the first direction X. An orthographic projection of each connecting unit 142u on the array substrate 110 covers orthographic projections of all electrode blocks 141s in the corresponding column on the array substrate 110. The multiple connecting units 142u may be electrically interconnected via an electrical connecting structure 143, so that the electrode blocks 141s of the light-transmitting display panel 100 are connected as a common electrode of the light-transmitting display panel 100 via the connecting units 142u and the electrical connecting structure 143. The electrical connecting structure 143 may be located at a same end along the extension direction of the connecting units 142u. The electrical connecting structure 143 is made of a conductive material, and may be formed simultaneously with the connecting units 142u or in a separate step.

According to the light-transmitting display panel 100 according to the above embodiments, adjacent columns of electrode blocks 141s in the multiple columns of electrode blocks 141s are spaced from each other, and adjacent connecting units 142u are spaced from each other along the first direction X, so that the light-transmitting performance between adjacent columns of electrode blocks 141s of the light-transmitting display panel 100 is further improved, which improves the average light-transmitting performance of the light-transmitting display panel 100, thereby achieving higher photosensitive performance of photosensitive components when the photosensitive components are integrated on the back of the display panel.

Figure 10:
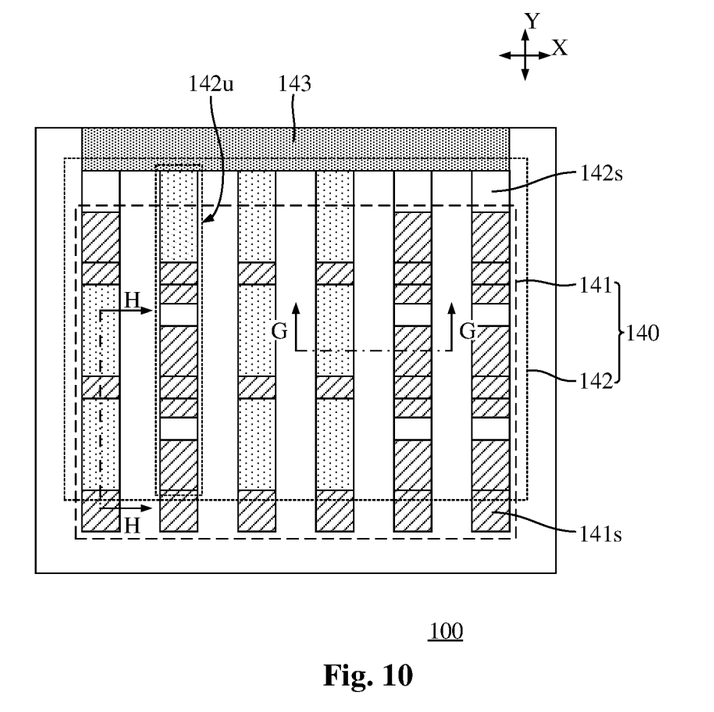
FIG. 10 is a schematic top view of a light-transmitting display panel according to a fourth embodiment of the present application, where the second sub-electrode layer includes multiple connecting units arranged along the first direction, and each of the connecting units interconnects electrode blocks in a corresponding column of the multiple columns of electrode blocks.
Figure 11:
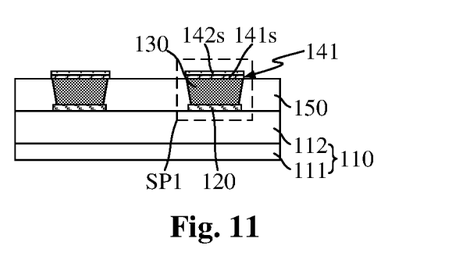
FIG. 11 is a schematic cross-sectional view along the G-G direction shown in FIG. 10.
Figure 12:
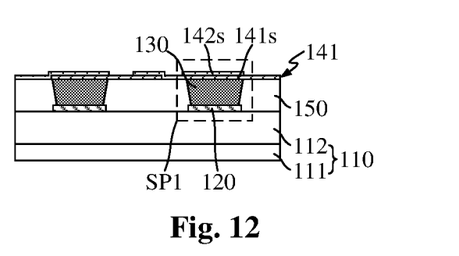
FIG. 12 is a schematic cross-sectional view along the H-H direction shown in FIG. 10.

FIG. 10 is a schematic top view of a light-transmitting display panel according to a fourth embodiment of the present application. FIG. 11 is a schematic cross-sectional view along the G-G direction shown in FIG. 10. FIG. 12 is a schematic cross-sectional view along the H-H direction shown in FIG. 10. A part of the structure of the light-transmitting display panel 100 according to the fourth embodiment is the same as that of the light-transmitting display panel 100 according to the first embodiment. Differences between the structure of the light-transmitting display panel 100 according to the fourth embodiment and the light-transmitting display panel 100 according to the first embodiment will be described below, and the similarities will not be described in detail.

In this embodiment, the electrode blocks 141s are arranged in multiple columns, the multiple columns of electrode blocks 141s are arranged along the first direction X, and each column of the multiple columns of electrode blocks 141s includes a plurality of electrode blocks 141s arranged at intervals in the second direction Y perpendicular to the first direction X. The second sub-electrode layer 142 includes a plurality of connecting units 142u arranged along the first direction X, and each connecting unit 142u interconnects the electrode blocks 141s of the corresponding columns in the plurality of columns of electrode blocks 141s.

In this embodiment, adjacent connecting units 142u are spaced apart from each other in the first direction X, each connecting unit 142u includes a plurality of connecting blocks 142s arranged at intervals in the second direction Y, and each connecting block 142s is connected to the second adjacent electrode blocks 141s in the direction Y. The plurality of connecting units 142u may be electrically interconnected through the electrical connecting structure 143, so that each electrode block 141s of the light-transmitting display panel 100 is connected as a common electrode of the light-transmitting display panel 100 through the connecting unit 142u and the electrical connecting structure 143. The electrical connecting structure 143 may be located at the same end of the extension direction of the connecting units 142u. For example, in this embodiment, the electrical connecting structure 143 interconnects connecting blocks 142s of the connecting units 142u at a same end of the extension direction. The electrical connecting structure 143 is made of a conductive material, and may be formed simultaneously with the connecting blocks 142s of the connecting units 142u or in a separate step.

Optionally, a shape and a size of an orthographic projection of each connecting block 142s on the array substrate are the same as a shape and a size of the orthographic projection of each electrode block 141s on the array substrate 110. A spacing between electrode blocks adjacent in the second direction Y is smaller than a length of an electrode block 141s in the second direction Y.

In the light-transmitting display panel 100 according to the above embodiments, the orthographic projection of the connecting block 142 on the array substrate and the orthographic projection of the electrode block 141 on the array substrate 110 are the same in shape and size, so that the connecting block 142 and the electrode block 141 can be formed by patterning using a same mask plate which saves production costs and improves the production efficiency of the light-transmitting display panel 100. The second electrode layer group 140 of the light-transmitting display panel 100 according to the above embodiments may for example be formed by the following method.

Vapor deposition is performed using a mask plate to form one of the electrode blocks 141s and the connecting blocks 142s on the first emitting structure 130. The mask plate includes multiple columns of openings arranged along a first direction X, each column of the multiple columns of openings includes multiple openings arranged at intervals along a second direction Y. The second direction Y is perpendicular to the first direction X. A spacing between openings adjacent in the second direction Y is smaller than a length of an opening in the second direction Y. For example, in this step, the electrode blocks 141s are formed on the first light-emitting structure 130.

Then the mask plate is translated along the second direction Y by a preset distance. The vapor deposition is performed using the mask plate to form the other one of the electrode blocks 141s and the connecting blocks 142s. The preset distance is greater than the spacing between the openings adjacent in the second direction Y and is less than the length of the opening in the second direction Y. For example, in this step, the connecting block 142 is formed, and the connecting blocks 142 connects the adjacent electrode blocks 141s in the second direction Y. In some implementations, while connecting the adjacent electrode blocks 141s, the orthographic projection of the connecting block 142s on the array substrate 110 covers the orthographic projection of at least one first electrode 120 on the array substrate 110, so that a film layer of the second electrode layer group 140 in the region corresponding to the light-emitting structure 130 is thick, which improves the displaying effect.

In addition, an electrical connecting structure 143 connecting the connecting blocks 142s adjacent in the first direction X is formed. The electrical connecting structure 143 may also be formed by performing vapor deposition on a conductive material.

This embodiment of the present application further provides a display panel, which may be an OLED display panel.

Figure 13:
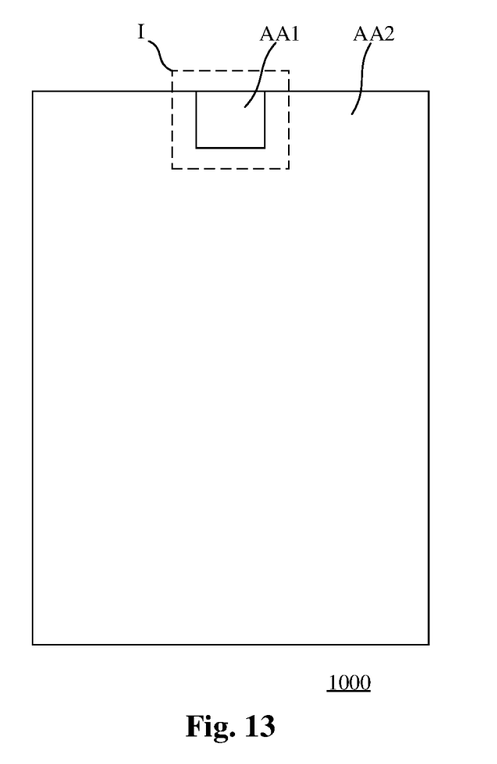
FIG. 13 is a schematic top view of a display panel according to a fifth embodiment of the present application.
Figure 14:
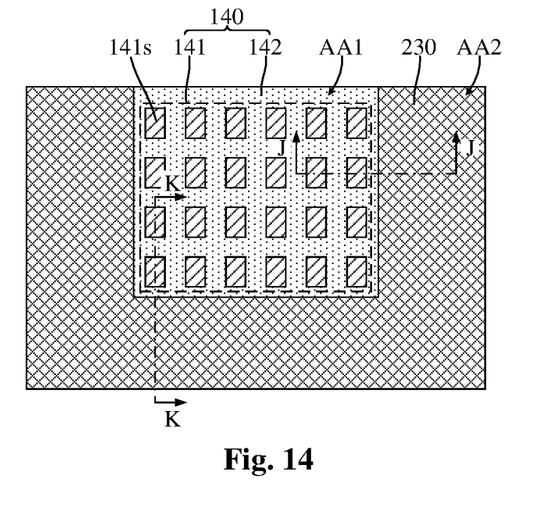
FIG. 14 is a schematic enlarged partial view of the I region shown in FIG. 13.
Figure 15:
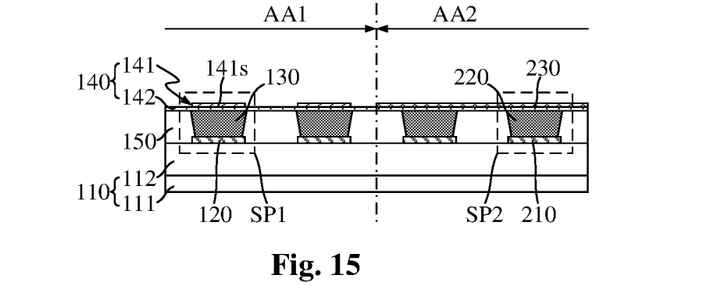
FIG. 15 is a schematic cross-sectional view along the J-J direction shown in FIG. 14.
Figure 16:
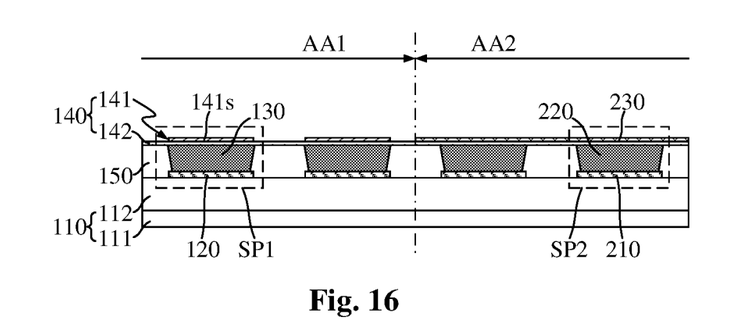
FIG. 16 is a schematic cross-sectional view along the K-K direction shown in FIG. 14.

FIG. 13 is a schematic top view of a display panel according to a fifth embodiment of the present application. FIG. 14 is a schematic enlarged partial view of the region I shown in FIG. 13. FIG. 15 is a schematic cross-sectional view along the J-J direction shown in FIG. 14. FIG. 16 is a schematic cross-sectional view along the K-K direction shown in FIG. 14. The display panel 1000 has a first display region AA1 and a second display region AA2 adjoining each other. Transmittance of the first display region AA1 is greater than transmittance of the second display region AA2. The first display region AA1 of the display panel 1000 is configured as the light-transmitting display panel 100 according to any one of the above embodiments.

In the display panel 1000 according to the fifth embodiment, for illustration, the first display region AA1 of the display panel 1000 is exemplified as being configured as the light-transmitting display panel 100 according to the above first embodiment.

Here, preferably, the transmittance of the first display region AA1 is greater than or equal to 15%. In order to ensure that the transmittance of the first display region AA1 is greater than 15%, greater than 40%, or even more, transmittance of at least some of functional film layers of the display panel 1000 according to this embodiment of the present application in the first display region AA1 is greater than 80% or even greater than 90%.

The light-transmitting display panel 100 includes an array substrate 110, first electrodes 120, one or more first light-emitting structures 130, and a second electrode layer group 140. The first electrodes 120 are located on the array substrate 110. Optionally, the first electrodes 120 are arranged in an array. Each of the first light-emitting structures 130 is located on one of the first electrodes 120. The second electrode layer group 140 is located on the first light-emitting structures 130. Each first electrode 120, its corresponding first light-emitting structure 130, and its corresponding second electrode layer group 140 form a first sub-pixel SP1.

The second electrode layer group 140 includes a first sub-electrode layer 141 and a second sub-electrode layer 142 that are stacked. The first sub-electrode layer 141 includes electrode blocks 141s spaced from one another. An orthographic projection of each of the electrode blocks 141s on the array substrate 110 covers an orthographic projection of at least one first electrode 120 on the array substrate 110. The second sub-electrode layer 142 connects at least a part of adjacent electrode blocks 141s. Light-transmitting performance of the second sub-electrode layer 142 is greater than light-transmitting performance of the electrode block 141s. The second sub-electrode layer 142 can directly or indirectly electrically interconnect the electrode blocks 141s, so that the second electrode layer group 140 is a common electrode of the first display region AA1.

In the display panel 1000 according to the embodiment of the present application, the transmittance of the first display region AA1 is greater than the transmittance of the second display region AA2, so that photosensitive components can be integrated on the back of the first display region AA1 of the display panel 1000, to realize that, for example, photosensitive components such as a camera are integrated under the screen and the first display region AA1 can display images at the same time, which increases the display area of the display panel 1000 and realizes the full-screen design of the display device.

In addition, the second electrode layer group 140 of the first display region AA1 includes first sub-electrode layer 141 and a second sub-electrode layer 142 that are stacked. Orthographic projections of the electrode blocks 141s included in the first sub-electrode layer 141 on the array substrate 110 cover the orthographic projection of at least one first electrode 120 on the array substrate 110, which ensures that the formed first sub-pixel SP1 has high color accuracy. The second sub-electrode layer 142 connects at least a part of adjacent electrode blocks 141s. Light-transmitting performance of the second sub-electrode layer 142 is greater than that of the electrode blocks 141s, thereby improving the light-transmitting performance of the non-luminous regions around the first sub-pixels SP1 while ensuring the normal displaying by the first sub-pixels SP1, which further improves average light-transmitting performance of the first display region AA1. When the photosensitive components are integrated on the back of the first display region AA1, the photosensitive component can have higher photosensitive performance.

Optionally, the display panel 1000 may further include third electrodes 210, one or more second light-emitting structures 220, and fourth electrodes 230. The third electrodes 210, the second light-emitting structures 220, and the fourth electrodes 230 are located in the second display region AA2.

The third electrode 210 is located on the array substrate 110. Optionally, the third electrodes 210 are arranged in an array. The second light-emitting structures 220 are located on the third electrodes 210. Optionally, the pixel defining layer 150 includes first pixel openings located in the first display region AA1 and second pixel openings located in the second display region AA2. The first pixel openings are configured to receive the first light-emitting structure 130s, and the second pixel openings are configured to receive the second light-emitting structures 220. Each of the fourth electrodes 230 is located on one of the second light-emitting structures 220.

One of the third electrode 210 and the fourth electrode 230 is an anode, and the other is a cathode. Here, for illustration, the third electrode 210 is exemplified as an anode and the fourth electrode 230 is exemplified as a cathode. Each third electrode 210, its corresponding second light-emitting structure 220, and its corresponding fourth electrode 230 form a second sub-pixel SP2. The third electrode 210 may be connected to a corresponding pixel circuit in the device layer, so that the pixel circuit drives the displaying by the second sub-pixel SP2.

Optionally, an area of the first electrode 120 of the first sub-pixel SP1 is smaller than an area of the third electrode 210 of the second sub-pixel SP2 of a same color.

Optionally, the third electrode 210 may be configured to have a same material and a same layer structure as the first electrode 120. For example, the third electrode 210 is a reflective electrode.

The second light-emitting structure 220 may be configured to be of a same type as the first light-emitting structure 130. The second light-emitting structure 220 and the first light-emitting structure 130 of a same type have a same material and a same layer structure.

Optionally, the second sub-electrode layer 142 of the second electrode layer group 140 is electrically connected to the fourth electrode 230. That is, the second electrode layer group 140 and the fourth electrode 230 are interconnected as a common electrode of the display panel 1000.

Figure 17:
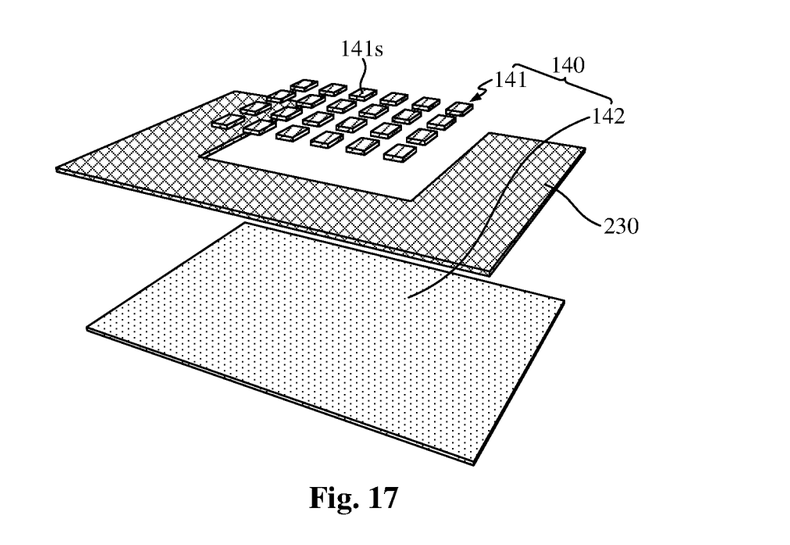
FIG. 17 is a schematic exploded perspective view of a second electrode layer group and a fourth electrode in the I region shown in FIG. 13.

The connection manner of the second sub-electrode layer 142 and the fourth electrode 230 may be adjusted according to design requirements. For example, as shown in FIG. 17, which is a schematic exploded perspective view of the second electrode layer group and the fourth electrode in the region I shown in FIG. 13, in this embodiment, the second sub-electrode layer 142 is a continuous and complete plane structure. The orthographic projection of the second sub-electrode layer 142 on the array substrate 110 covers the orthographic projections of all electrode blocks 141s on the array substrate 110 and an orthographic projection of the fourth electrode 230 on the array substrate 110.

In a formation process of the second electrode layer group and the fourth electrode of the above display panel 1000, the second sub-electrode layer 142 may be formed first, and the second sub-electrode layer 142 may cover the first display region AA1 and the second display region AA2. Then, multiple patterned electrode blocks 141s are formed on the second sub-electrode layer 142 of the first display region AA1, and the fourth electrodes 230 are formed on the second sub-electrode layer 142 of the second display region AA2.

Figure 18:
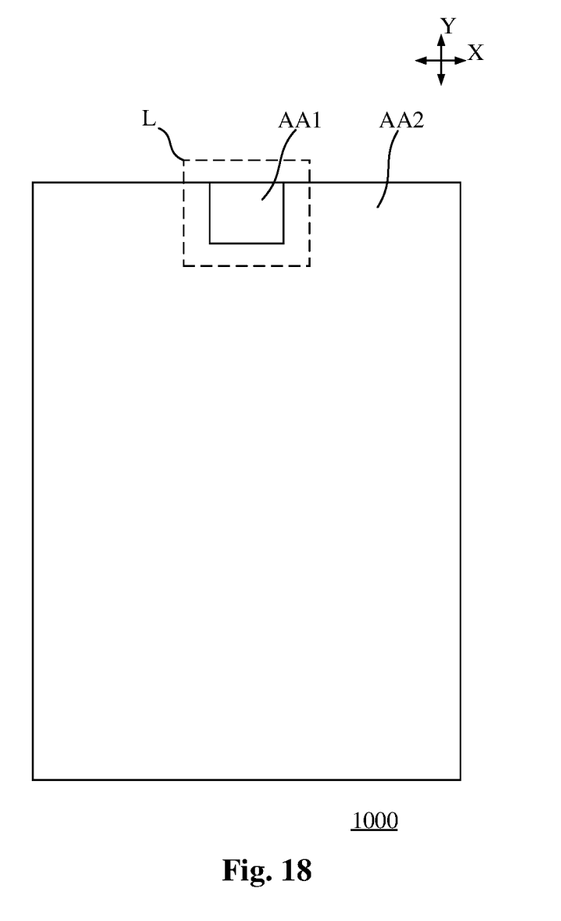
FIG. 18 is a schematic top view of a display panel according to a sixth embodiment of the present application, where the second sub-electrode layer includes multiple connecting units arranged along a first direction, and each of the connecting units interconnects electrode blocks in a corresponding column of the multiple columns of electrode blocks.
Figure 19:
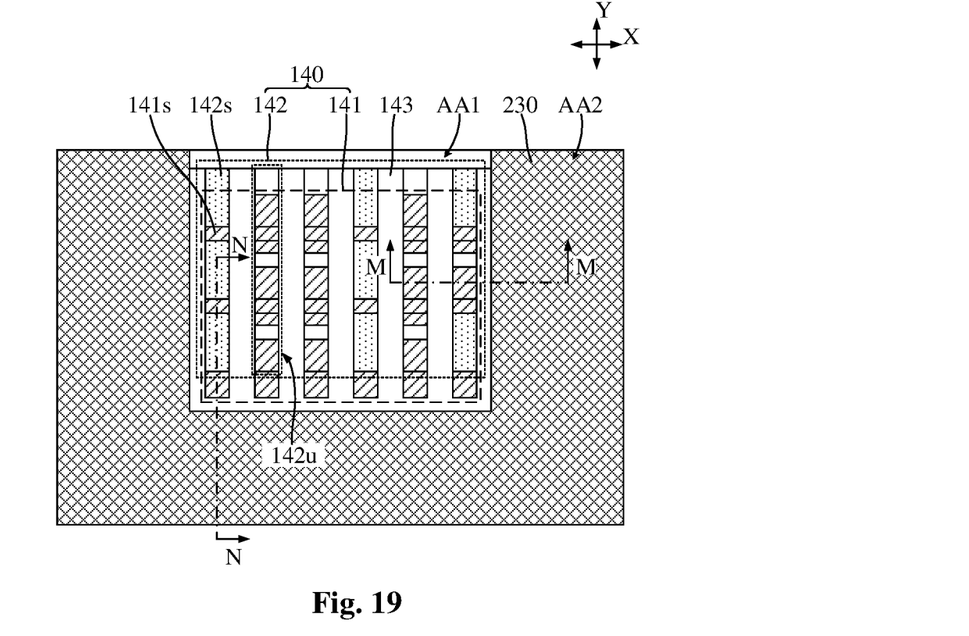
FIG. 19 is a schematic enlarged partial view of the L region shown in FIG. 18.
Figure 20:
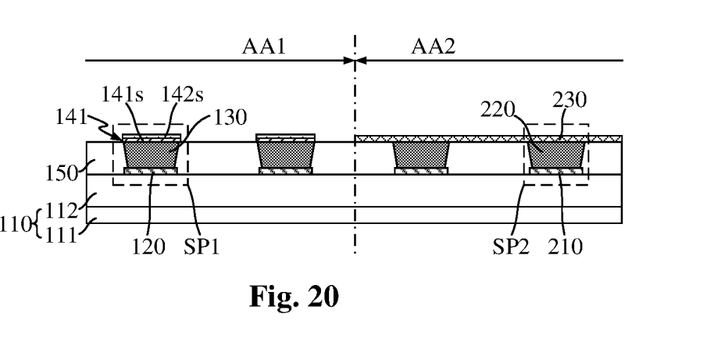
FIG. 20 is a schematic cross-sectional view along the M-M direction shown in FIG. 19.
Figure 21:
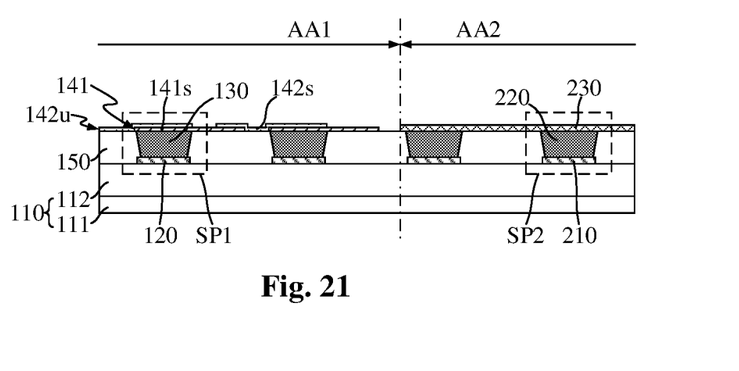
FIG. 21 is a schematic cross-sectional view along the N-N direction shown in FIG. 19.

FIG. 18 is a schematic top view of a display panel according to a sixth embodiment of the present application. FIG. 19 is a schematic enlarged partial view of the L region shown in FIG. 18. FIG. 20 is a schematic cross-sectional view along the M-M direction shown in FIG. 19. FIG. 21 is a schematic cross-sectional view along the N-N direction shown in FIG. 19. The display panel 1000 according to the sixth embodiment has a first display region AA1 and a second display region AA2 adjoining each other. Transmittance of the first display region AA1 is greater than transmittance of the second display region AA2. For illustration, the first display region AA1 of the display panel 1000 according to the sixth embodiment is exemplified as being configured as the light-transmitting display panel 100 according to the above fourth embodiment.

Hereinafter, differences between the display panel 1000 according to the sixth embodiment and the display panel 1000 according to the fifth embodiment will be described, and the similarities will not be described in detail.

In this embodiment, in the first display region AA1, the electrode blocks 141s are arranged in multiple columns. The multiple columns of electrode blocks 141s are arranged along the first direction X. Each column of the multiple columns of electrode blocks 141s includes multiple electrode blocks 141s arranged at intervals along the second direction Y. The second direction Y is perpendicular to the first direction X. The second sub-electrode layer 142 includes multiple connecting units 142u arranged along the first direction X. Each connecting unit 142u interconnects electrode blocks 141s in a corresponding columns of the multiple columns of electrode blocks 141s.

Adjacent connecting units 142u are spaced from each other in the first direction X. Each connecting unit 142u includes multiple connecting blocks 142s arranged at intervals along the second direction Y. Each connecting block 142s connects electrode blocks 141s adjacent in the second direction Y.

The multiple connecting units 142u may be electrically interconnected via the electrical connecting structure 143, so that the electrode blocks 141s of the first display region AA1 are connected as a common electrode of the first display region AA1 via the connecting units 142u and the electrical connecting structure 143. The electrical connecting structure 143 is further connected to the fourth electrodes 230, so that the second electrode layer group 140 and the fourth electrodes 230 are interconnected as a common electrode of the display panel 1000.

The electrical connecting structure 143 may be located at a same end of the extension direction of the connecting units 142u. For example, in this embodiment, the electrical connecting structure 143 electrically interconnects connecting blocks 142s in respective connecting units 142u that are at a same end of the extension direction. The electrical connecting structure 143 is made of a conductive material, and may be formed simultaneously with the connecting blocks 142s of the connecting units 142u or in a separate step.

Optionally, a shape and a size of the orthographic projection of each connecting block 142s on the array substrate 110 are the same as a shape and a size of the orthographic projection of each electrode block 141s on the array substrate 110. A spacing between the electrode blocks 141s adjacent in the second direction Y is smaller than a length of an electrode block 141s in the second direction Y.

The second electrode layer group 140 and the fourth electrodes 230 of the display panel 1000 according to the above embodiments may for example be formed by the following method.

The fourth electrodes 230 are formed on the second light-emitting structures 220 of the second display region AA2. The fourth electrodes 230 may be arranged to cover the second display region AA2.

Vapor deposition is performed using a mask plate to form the electrode blocks 141s on the first emitting structure 130. The mask plate includes multiple columns of openings arranged along a first direction X, and each column of the multiple columns of openings includes multiple openings arranged at intervals along a second direction Y. The second direction Y is perpendicular to the first direction X. A spacing between openings adjacent in the second direction Y is smaller than a length of an opening in the second direction Y.

Then the mask plate is translated closer to the second display region AA2 along the second direction Y by a preset distance. The vapor deposition is performed using the mask plate to form the connecting blocks 142s. The preset distance is greater than the spacing between the openings adjacent in the second direction Y and is less than the length of the opening in the second direction Y. Optionally, while connecting the adjacent electrode blocks 141s, the orthographic projection of the connecting block 142s on the array substrate 110 covers the orthographic projection of at least one first electrode 120 on the array substrate 110, so that a film layer of the second electrode layer group 140 in the region corresponding to the light-emitting structure 130 is thick, which improves the displaying effect.

In addition, an electrical connecting structure 143 connecting the connecting blocks 142s adjacent in the first direction X is formed. The electrical connecting structure 143 may also be formed by performing vapor deposition on a conductive material. The electrical connecting structure 143 connects connecting blocks 142s adjacent in the first direction X, and connects the fourth electrodes 230.

The embodiments of the present application further provide a method for manufacturing a light-transmitting display panel, according to which the light-transmitting display panel 100 according to the above embodiments can be manufactured.

Figure 22:
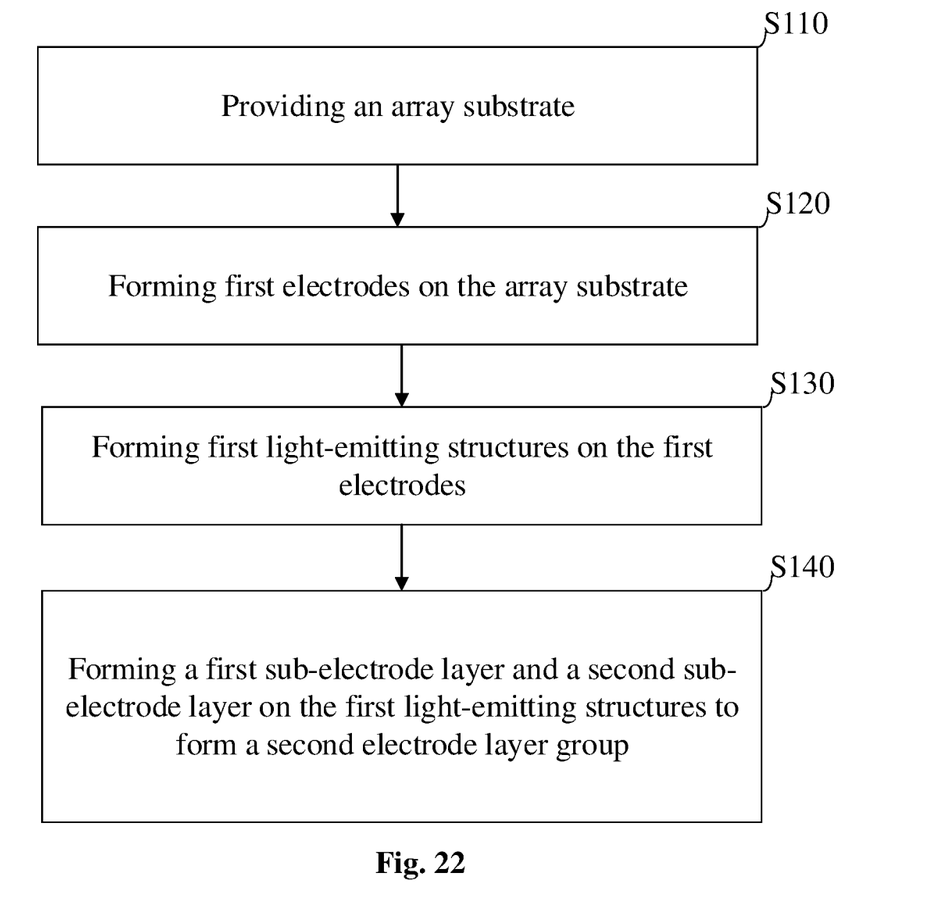
FIG. 22 is a flowchart of a method for manufacturing a light-transmitting display panel according to an embodiment of the present application.

FIG. 22 is a flowchart of a method for manufacturing a light-transmitting display panel according to an embodiment of the present application. The method for manufacturing the light-transmitting display panel includes steps S110 to S140.

At step S110, an array substrate is provided. Providing the array substrate may include providing a substrate and forming a device layer on the substrate.

At step S120, first electrodes are formed on the array substrate. The first electrode may be, for example, an anode of an OLED device. The first electrode may be formed by patterning, thereby obtaining multiple first electrodes arranged in an array. Optionally, the first electrode is a light-transmitting electrode, and its material may be, for example, a transparent conductive material such as ITO or IZO. Optionally, the first electrode is a reflective electrode, which may include, for example, a first light-transmitting conductive layer, a reflective layer on the first light-transmitting conductive layer, and a second light-transmitting conductive layer on the reflective layer. The first light-transmitting conductive layer and the second light-transmitting conductive layer can be ITO, IZO, etc., and the reflective layer may be a metal layer which for example, may be made of silver.

At step S130, one or more first light-emitting structures are formed on the first electrodes. Optionally, after the above first electrodes are formed, a pixel defining layer may be formed on the array substrate. The pixel defining layer may be patterned so that the pixel defining layer includes multiple pixel openings corresponding to positions of the first electrodes. Forming the first light-emitting structures may include forming the first light-emitting structures on the first electrodes in the pixel openings. The first light-emitting structure may include a light emitting layer. Depending on the design requirements of the first light-emitting structure, the first light-emitting structure may further include at least one of a hole injection layer, a hole transport layer, an electron injection layer, or an electron transport layer.

At step S140, a first sub-electrode layer and a second sub-electrode layer are formed on the first light-emitting structures to form a second electrode layer group. The first sub-electrode layer and the second sub-electrode layer are stacked. The second electrode layer group may be, for example, a cathode of the OLED device. Each first electrode, its corresponding first light-emitting structure, and its corresponding second electrode layer group form a first sub-pixel.

In this embodiment, forming the first sub-electrode layer includes forming electrode blocks spaced from each other. A position of each electrode block is corresponding to a position of at least one first electrode. Forming the second sub-electrode layer includes forming the second sub-electrode layer that can connect at least a part of adjacent electrode blocks. The light-transmitting performance of the second sub-electrode layer is greater than the 1 light-transmitting performance of the electrode blocks.

The order of forming the first sub-electrode layer and forming the second sub-electrode layer may be adjusted depending on process requirements. Optionally, the first sub-electrode layer may be formed before the second sub-electrode layer. In other embodiments, the second sub-electrode layer may be formed before the first sub-electrode layer.

Optionally, the first sub-electrode layer may be an ytterbium layer or a magnesium-silver alloy layer, so that the first sub-electrode layer, the first electrode and the layer structure therebetween can create a suitable microcavity effect. The displaying effect by the formed first sub-pixel can be improved, and the likelihood of occurrence of color shift can be reduced.

Optionally, the second sub-electrode layer may be an indium tin oxide layer or an indium zinc oxide layer, thereby improving the light-transmitting performance of the intervening regions between adjacent electrode blocks of the first sub-electrode layer.

Optionally, forming the second sub-electrode layer includes forming the second sub-electrode layer by electron beam vapor deposition, sputtering deposition, or thermal deposition.

In the method for manufacturing the light-transmitting display panel according to this embodiment of the present application, forming the first sub-electrode layer includes forming electrode blocks spaced from each other. The orthographic projection of each of the electrode blocks on the array substrate covers an orthographic projection of at least one first electrode on the array substrate, which ensures that the formed first sub-pixel has high color accuracy. The second sub-electrode layer connects at least a part of adjacent electrode blocks, and the light-transmitting performance of the second sub-electrode layer is greater than that of the electrode blocks, which improves light-transmitting performance of the non-luminous region around the subpixels while ensuring the normal displaying by the subpixels, thereby improving the average light-transmitting performance of the light-transmitting display panel.

Optionally, the second sub-electrode layer includes connecting blocks, and forming the second electrode layer group on the first light-emitting structure includes the following steps.

Vapor deposition is performed using a mask plate to form either of the electrode blocks or the connecting blocks on the first light-emitting structure. The mask plate includes multiple columns of openings arranged along a first direction. Each column of the multiple columns of openings includes multiple openings arranged at intervals along a second direction. The second direction is perpendicular to the first direction. A spacing between openings adjacent in the second direction is smaller than a length of an opening in the second direction.

For example, in this step, electrode blocks are formed on the first light-emitting structure. At this time, the electrode blocks are arranged in multiple columns, the multiple columns of electrode blocks are arranged along the first direction, and each column of the multiple columns of electrode blocks includes multiple electrode blocks arranged at intervals in the second direction.

Then, the mask plate is translated along the second direction by a preset distance, and vapor deposition is performed using the mask plate to form the other of the electrode blocks and the connecting blocks on the first light-emitting structure. The preset distance is greater than the spacing between the openings adjacent in the second direction and is less than the length of the opening in the second direction.

For example, in this step, the connecting block is formed. The connecting block connects electrode blocks adjacent in the second direction. A shape and a size of the orthographic projection of each connecting block on the array substrate are the same as a shape and a size of the orthographic projection of each electrode block on the array substrate.

Then, an electrical connecting structure 143 that connects connecting blocks 142s adjacent in the first direction X can be formed. The electrical connecting structure 143 may also be formed by performing vapor deposition on a conductive material.

In the method for manufacturing the light-transmitting display panel according to the above embodiments, the first sub-electrode layer and the second sub-electrode layer can be formed by patterning using a same mask plate, which saves production costs and improves the manufacturing efficiency of the light-transmitting display panel.

The above-described embodiments of the present application do not exhaust all the details, and the present application are not limited to the specific embodiments described. It is apparent that, many modifications and changes can be made according to the above description. The selected and specifically described embodiments in the description are for better explanation of the principles and practical use of the present application, so that those skilled in the art can make good use of this application and make modifications on the basis of this application. The present application is only limited by the claims and their full scope and equivalents.

What is claimed is:

1. A light-transmitting display panel comprising:
an array substrate;
a plurality of first electrodes located on the array substrate;
a plurality of first light-emitting structures, each of the first light-emitting structures being located on a respective first electrode of the plurality of first electrodes; and
a second electrode layer group located on each first light-emitting structure and comprising a first sub-electrode layer and a second sub-electrode layer that are stacked, wherein the first sub-electrode layer comprises a plurality of electrode blocks spaced from each other, an orthographic projection of each of the plurality of electrode blocks on the array substrate covers an orthographic projection of at least one of the plurality of first electrodes on the array substrate, the second sub-electrode layer connects at least a part of adjacent electrode blocks of the plurality of electrode blocks, a transmittance of the second sub-electrode layer is greater than a transmittance of the plurality of electrode blocks, each first electrode of the plurality of first electrodes, a corresponding first light-emitting structure, a corresponding second electrode layer group form a first sub-pixel, the plurality of electrode blocks are arranged in multiple columns, the multiple columns are arranged along a first direction, each of the multiple columns comprises multiple of the plurality of electrode blocks arranged at intervals along a second direction, the second direction is perpendicular to the first direction, the second sub-electrode layer comprises multiple connecting units arranged along the first direction, adjacent connecting units of the multiple connecting units are spaced from each other along the first direction, a slot is defined between the adjacent connecting units, each of the connecting units interconnects the multiple of the plurality of electrode blocks in a corresponding column of the multiple columns, each of the connecting units comprises multiple connecting blocks arranged at intervals along the second direction, and a plurality of slits, each slit of the plurality of slits is defined between adjacent two connecting blocks of one connecting unit, the slit exposes a part of the electrode block, and each of the connecting blocks connects electrode blocks of the plurality of electrode blocks adjacent in the second direction, an orthographic projection of each of the connecting blocks on the array substrate overlaps orthographic projections of two electrode blocks adjacent in the second direction on the array substrate respectively.

2. The light-transmitting display panel according to claim 1, wherein a shape and a size of an orthographic projection of each of the connecting blocks on the array substrate are the same as a shape and a size of the orthographic projection of each of the plurality of electrode blocks on the array substrate, and a spacing between the electrode blocks adjacent in the second direction is smaller than a length of the electrode block in the second direction.

3. The light-transmitting display panel according to claim 1, wherein the first sub-electrode layer comprises an ytterbium layer.

4. The light-transmitting display panel according to claim 1, wherein the second sub-electrode layer comprises an indium tin oxide layer or an indium zinc oxide layer.

5. The light-transmitting display panel according to claim 1, wherein an orthographic projection of each of the at least one first light-emitting structure on the array substrate is composed of one first shape unit or composed of two or more first shape units joined together, and the first shape unit comprises at least one shape selected from a group consisting of a circle, an oval, a dumbbell, a gourd, and a rectangle.

6. The light-transmitting display panel according to claim 1, wherein the orthographic projection of each of the first electrodes on the array substrate is composed of one second shape unit or composed of two or more second shape units, and the second shape unit comprises at least one shape selected from a group consisting of a circle, an oval, a dumbbell, a gourd, and a rectangle.

7. The light-transmitting display panel according to claim 1, wherein transmittance of the light-transmitting display panel is greater than or equal to 15%.

8. A display panel comprising a first display region and a second display region adjoining each other, wherein a transmittance of the first display region is greater than a transmittance of the second display region and the first display region of the display panel is configured as the light-transmitting display panel according to claim 1, and further comprising:
- a plurality of third electrodes located on the array substrate and located in the second display region;
- a plurality of second light-emitting structures, each of the second light-emitting structures being located on one of the third electrodes; and
- a plurality of fourth electrodes, each of the fourth electrodes being located on one of the second light-emitting structures, wherein the second sub-electrode layer of the second electrode layer group is electrically connected to the fourth electrodes, each of the third electrodes, a corresponding second light-emitting structure, and a corresponding one of the fourth electrodes form a second sub-pixel, and an area size of the first electrode of the first sub-pixel is smaller than an area size of the third electrode of the second sub-pixel of a same color.

9. The display panel according to claim 8, wherein the second sub-electrode layer of the second electrode layer group is electrically connected to the fourth electrodes.

10. The display panel according to the claim 1, wherein the second sub-electrode layer is located on the first light-emitting structure, and the first sub-electrode layer is located on the second sub-electrode layer.

11. The display panel according to claim 1, wherein the first sub-electrode layer is located on the first light-emitting structure, and the second sub-electrode layer is located on the first sub-electrode layer.

12. The display panel according to claim 1, further comprising:
- an electrical connecting structure, located at a same end along an extension direction of the connecting units, wherein the multiple connecting units are electrically interconnected via the electrical connecting structure.

13. The display panel according to the claim 1, wherein each electrode of the plurality of first electrodes is a reflective electrode.

14. The display panel according to claim 8, wherein each electrode of the plurality of third electrodes is a reflective electrode.

* * * * *